United States Patent [19]

Higa

[11] Patent Number: 4,698,736
[45] Date of Patent: Oct. 6, 1987

[54] PROTECTION CIRCUIT FOR A POWER CONVERTER APPARATUS

[75] Inventor: Osamu Higa, Tokyo, Japan

[73] Assignee: Kabushiki Kaisha Toshiba, Kanagawa, Japan

[21] Appl. No.: 942,399

[22] Filed: Dec. 16, 1986

[30] Foreign Application Priority Data

Dec. 16, 1985 [JP] Japan .................................. 60-282409
Dec. 16, 1985 [JP] Japan .................................. 60-282410

[51] Int. Cl.$^4$ ............................................. H02H 7/00
[52] U.S. Cl. ........................................ 363/51; 363/68; 361/104; 361/127
[58] Field of Search ....................... 363/50, 51, 53, 54, 363/56, 57, 68; 361/94, 104, 106, 110, 117, 118, 126, 127

[56] References Cited

U.S. PATENT DOCUMENTS 4,511,957 4/1985 Matsumura et al. .................. 363/54

FOREIGN PATENT DOCUMENTS 2935807 4/1981 Fed. Rep. of Germany ...... 361/106
0098903 4/1979 Japan .................................. 361/104

Primary Examiner—Peter S. Wong
Assistant Examiner—Judson H. Jones
Attorney, Agent, or Firm—Saidman, Sterne, Kessler & Goldstein

[57] ABSTRACT

A protection circuit for a power converter apparatus is disclosed which is made up of plural unit circuits, each comprising at least one fuse connected in series with a semiconductor element, such as a thyristor, and a non-linear resistor connected in parallel at least with the fuse. In this way fuses can be employed in a power converter apparatus of high voltage and current capacity. The unit circuits can be connected in series or in parallel or both to increase the current and/or voltage capacity of the power converter. Trigger fuses can be employed to halt operation of the unit in the event of fusing of one or more of the fuses.

11 Claims, 6 Drawing Figures 4,698,736

PROTECTION CIRCUIT FOR A POWER CONVERTER APPARATUS

FIELD OF THE INVENTION

This invention relates to a protection circuit for a power converter apparatus of the type comprising semiconductor elements connected in series-parallel fashion. More particularly, this invention relates to a protection circuit for a power converter of high voltage and large current capability, such as a thyristor converter for use in DC power transmission or as a power source for an electromagnet for plasma confinement in a nuclear fusion system. Still more particularly, the invention relates to a protection circuit for a power converter apparatus that can protect the semiconductor elements from damaging overcurrents.

BACKGROUND OF THE INVENTION

Semiconductor power converter circuits using fuses for over-current protection of the semiconductor switching elements are known.

In a first example, the carrying capacity of the semiconductor elements is chosen to be greater than the fusing current, so that when an overcurrent or a short-circuit occurs, the corresponding fuse or fuses are fused, interrupting the current, protecting the semiconductor elements. In a second example, found for instance in power converter circuits comprising plural semiconductor elements connected in parallel with one another, a fuse is connected in series with each semiconductor element. When one of the semiconductor elements is damaged, the corresponding fuse is fused, separating the damaged semiconductor element from other normal semiconductor elements. This allow continuous operation of the apparatus without interruption. Otherwise when a current above the semiconductor's current carrying capacity flows, the semiconductor element may explode, causing arcing. In some cases this causes a serious accident or a fire. In order to prevent explosion of the semiconductor elements, fuses are used to rapidly limit the shortcircuit current.

A further problem is experienced in connection with protection of large current, high voltage power converters. In fact it has been impossible to employ fuses for circuit protection of power converter apparatus of higher voltage, for the following reasons. As the current capacity of the power converter apparatus increases, the short-circuit current that flows through the semiconductor elements increases likewise. As an example, the DC voltage in a thyristor converter for use in DC power transmission can reach as high as 250 kV. Single unit fuses that can withstand such high voltages are not available. A plurality of lower voltage rating fuses can be connected in series; however, the diversity of fusing characteristics of the plural fuses will tend to result in a lack of uniformity in the arc voltages which exist when the respective fuses are fused. Accordingly, the remaining fuses are exposed to voltage beyond their inherent capabilities, and failures result.

Therefore, in thyristor converters of higher voltage, overcurrent protection has been provided relying on the gate control of thyristors, i.e., the gate shift or gate block thereof, instead of fuses. Effective overcurrent protection of thyristor converters of 3 kA rated current for DC power transmission has been achieved using circuits of this type. However, this current value is inadequate for power converter apparatus for use in connection with nuclear fusion experiments; such devices have DC power requirements on the order of several tens kV and several hundreds kA. Thyristor base control is inadequate for this application.

The increased demands for larger currents at higher voltages to be provided by power converter equipment therefore require improvement of the fused protection arrangements described above.

OBJECTS OF THE INVENTITON

Accordingly, one object of the present invention is to provide a highly reliable and safe power converter apparatus of high voltage and large current capacity which employs fuses for protection of semiconductor switching elements.

SUMMARY OF THE INVENTION

According to the present invention, a highly reliable and safe protection circuit employing fuses is provided for a high voltage and large current capacity power converter apparatus.

More specifically, according to the present invention, a protection circuit for a power converter is provided comprising plural semiconductor elements connected in seriesparallel fashion so as to constitute arms. The circuit includes unit circuits each comprising fuses connected in series with the semiconductor elements, and nonlinear resistors connected respectively in parallel with the series circuits of the fuses and semiconductor elements. The arc voltages which arise upon fusing are dissipated by the resistors so that the fuses serve to limit overcurrent in a safe manner. Trigger fuses can be used to signal the fusing of the fuses and to halt operations of the power conversion apparatus.

BRIEF DESCRIPTION OF THE DRAWINGS

A more complete appreciation of the invention and many of the attendant advantages thereof will be readily obtained as the same becomes better understood by reference to be following detailed description when considered in connection with the accompanying drawings, wherein.

DESCRIPTION OF THE PREFERRED EMBODIMENTS

Figure 1:
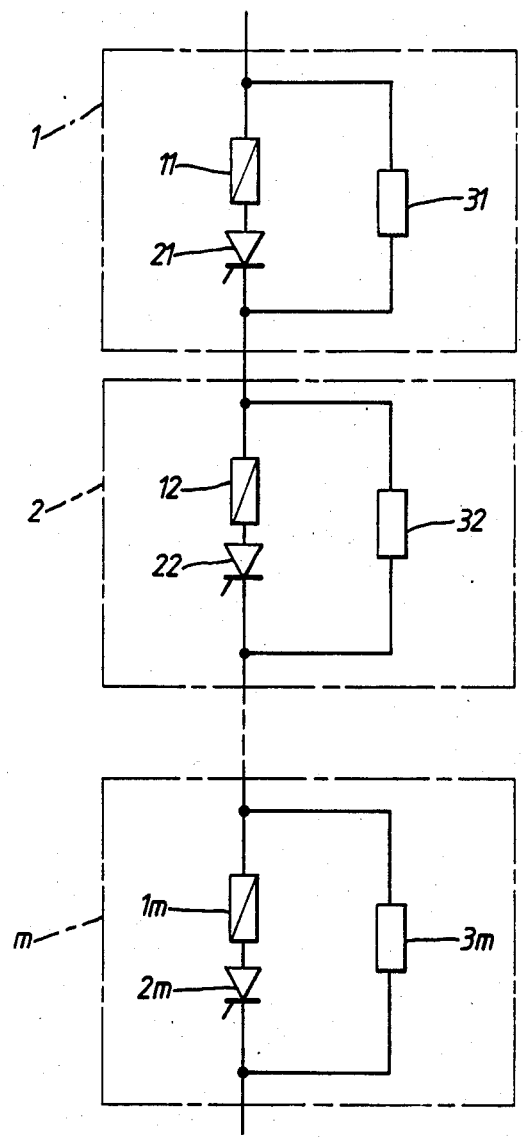
FIG. 1 is a schematic diagram illustrating a protection circuit for apower converter apparatus according to one embodiment of the present invention.

A first embodiment of the present invention is shown in FIG. 1. Elements 1, 2, ... m are identical unit protection circuits. Reference numerals 11, 12, ... 1m designate fuses, 21, 22, ... 2m semiconductor elements such as thyristors, and 31, 32, ... 3m non-linear resistors, As shown in FIG. 1, identical unit protection circuits 1, 2, ... m, each comprise nonlinear resistors 31, 32, ... 3m connected in parallel with the series combination of fuses 11, 12, ... 1m and thyristors 21, 22, ... 2m.

The circuit of FIG. 1 operates as follows. If an overcurrent is passed through thyristors 21, 22, ... 2m, fuses 11, 12, ... 1m initiate fusing. While the fuses 11, 12, ... 1m fuse, an arc voltage corresponding to the circuit voltage is developed across the fuses. According to the invention, the arc voltages developed across the fuses 11, 12, ... 1m are absorbed by the nonlinear resistors 31, 32, ... 3m up to the limiting voltage of the respective nonlinear resistors 31, 32, ... 3m. In this way the arc voltage is prevented from causing fires or other damaging accidents. Hence, the current-limiting function of the fuses 11, 12, ... 1m is effectively provided.

The nonlinear resistors referred to in discussion of the circuit of FIG. 1, and throughout this application, are circuit elements which are characterized in that as the current through the device increases, the voltage drop across the element increases nonlinearly to a limiting voltage. These elements may be as described in Ichinose, "TNR High performance ceramic varistor element," JEE, (July 1972).

Figure 2:
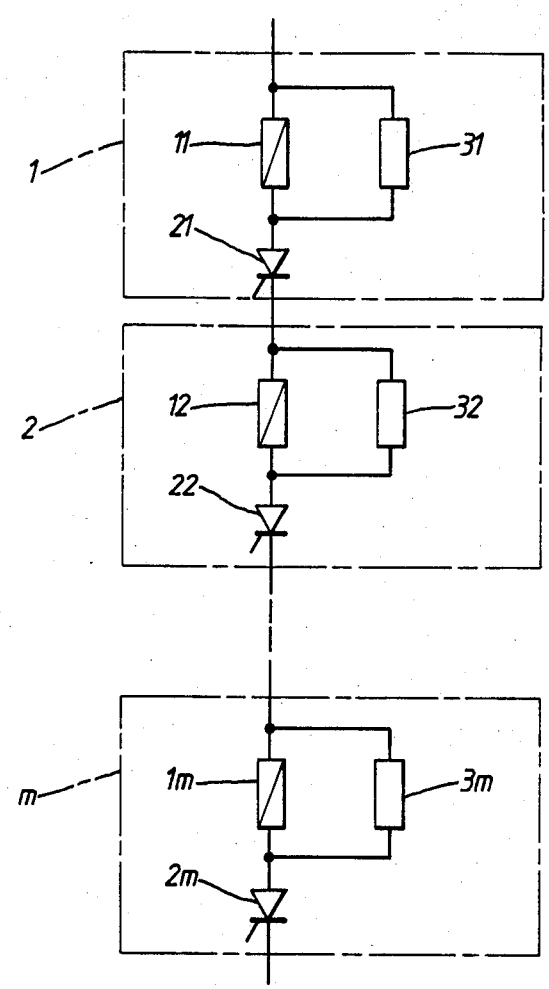
FIGS. 2-6 are schematic diagrams illustrating additional embodiments of protection circuits for power converter apparatus according to the present invention.

FIG. 2 shows another embodiment of this invention, in which a number of identical protection circuits 1, 2, ... m, are provided. Each comprises a fuse 11, 12, ... 1m and a nonlinear resistor 31, 32, ... 3m connected in parallel; these combinations are connected in series with thyristors 21, 22, ... 2m. As in the circuit of FIG. 1, any arc voltage developed across the fuses 11, 12, ... 1m is suppressed by nonlinear resistors 31, 32, ... 3m up to their voltage limits. The current-limiting function of the fuses is thus provided, while dangerous arcing is avoided.

Figure 3:
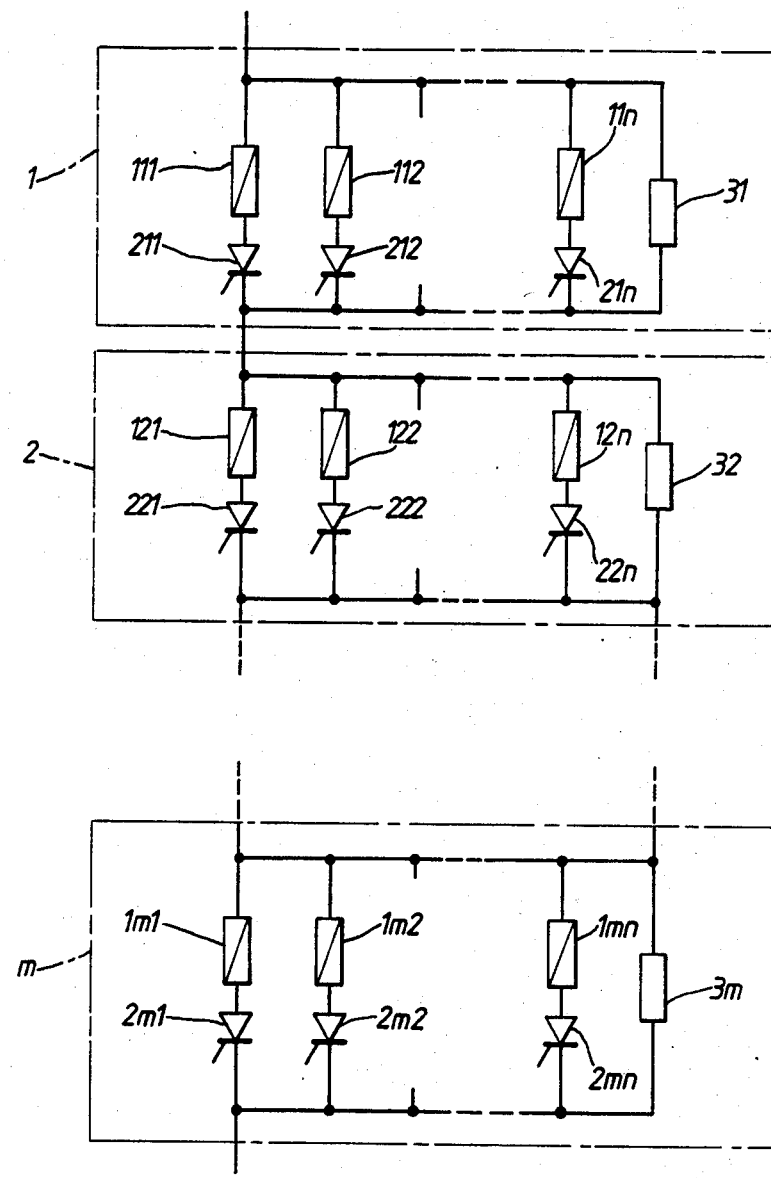

FIG. 3 shows a further embodiment of the current limiting circuit of the present invention, suitable for protection of a power converter apparatus of higher voltage and larger current, in which plural thyristors are connected in series-parallel fashion. This configuration is generally called a mesh connection. As will be observed from FIG. 3, the mesh connected configuration comprises identical unit circuits 1, 2, ... m, each of which comprises n combinations of fuses 11, 12, ... 11n and thyristors 211, 212, ... 21n connected in series. In FIG. 3, a single non-linear resistor 31, 32, ... 3m is connected in parallel with each of the unit circuits; a nonlinear resistor may also be provided connected in parallel with each of the n series circuits comprising a fuse and a thyristor.

Should a short-circuit current flow while the thyristors 211, 21n, ... 2mn are energized, all the fuses 111, 112, ... 1mn may fuse. When the fuses 111, 112, ... 1mn begin to fuse, an arc voltage corresponding to the respective circuit voltage is produced across the fuses 111, 112, ... 1mn. The arc voltage is suppressed by the non-linear resistors 31, 32, ... 3m, up to the resistors' voltage limit. The current-limiting function of the fuses is thus effectively provided.

The advantages of the circuit of the present invention are particularly apparent in connection with power converters of higher voltage and larger current. Namely, if a sufficient number n of separately fused parallel-connected thyristors are provided, a damaged thyristor may be removed from the circuit. The normal thyristors remain connected, allowing the operation of the apparatus to continue. Furthermore, the short-circuit current through each thyristor is effectively limited by the associated fuse, whereby explosion of the thyristor is avoided.

Figure 4:
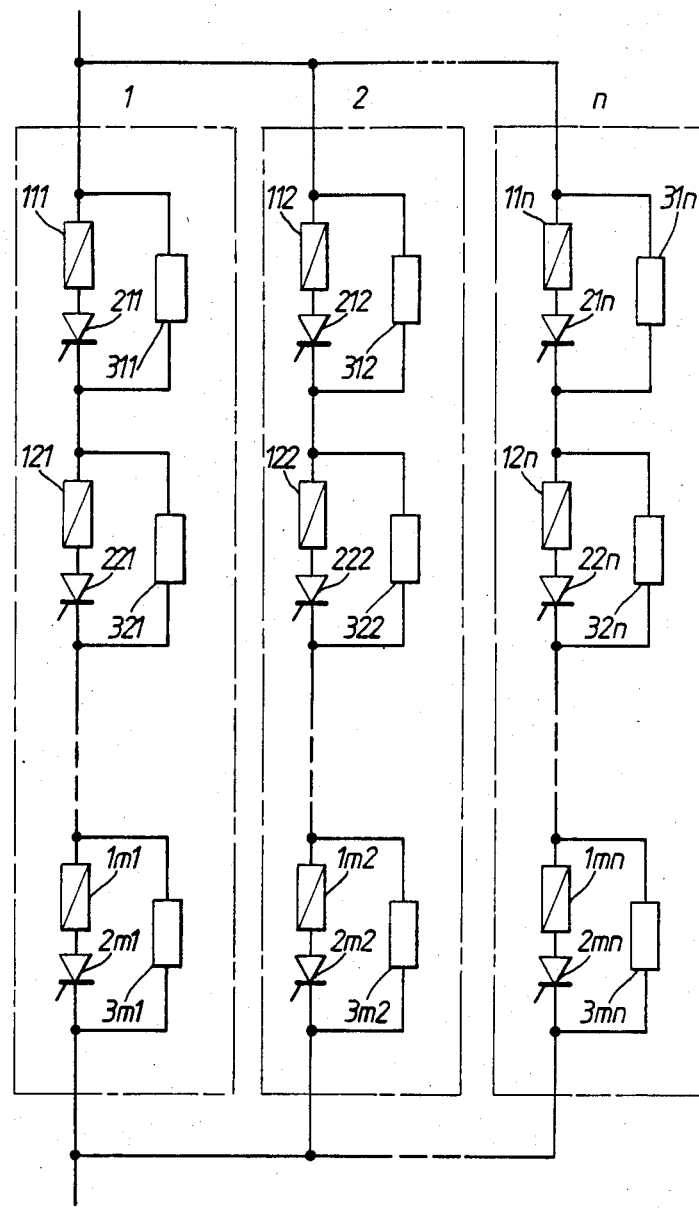

FIG. 4 shows another embodiment of the circuit of the present invention, in which a large number of thyristors 211, 212, ... 2mn are connected in series-parallel fashion for use in a power converter apparatus of high voltage and large current capacity. The configuration shown in FIG. 4 is generally called a string connection. In this circuit identical circuit elements 1, 2, ... n, each comprising m unit circuits comprising fuses 111, 112 ... 1mn, thyristors 211, 212, ... 2mn, and non-linear resistors 311, 312, ... 3mn, comparable to those of FIG. 1, are connected in parallel. The string connection provides the advantage that the plural series-connected thyristors 211, 221, ... 2m1, 212, 222, 2m2, ... 21n, 22n, ... 2mn, serve to offset the losses due to the forward voltage drops of the thyristors, whereby the current-sharing of the respective unit circuits 1, 2, ... n is improved. The function of the nonlinear resistors in the circuit of FIG. 4 is identical to that described in connection with the circuit of FIG. 3. The individual unit circuits 1, 2, ... n of FIG. 4, as shown are identical to the circuits of FIG. 1, but may alternatively be configured as shown in FIG. 2; the circuit function is unchanged.

Figure 5:
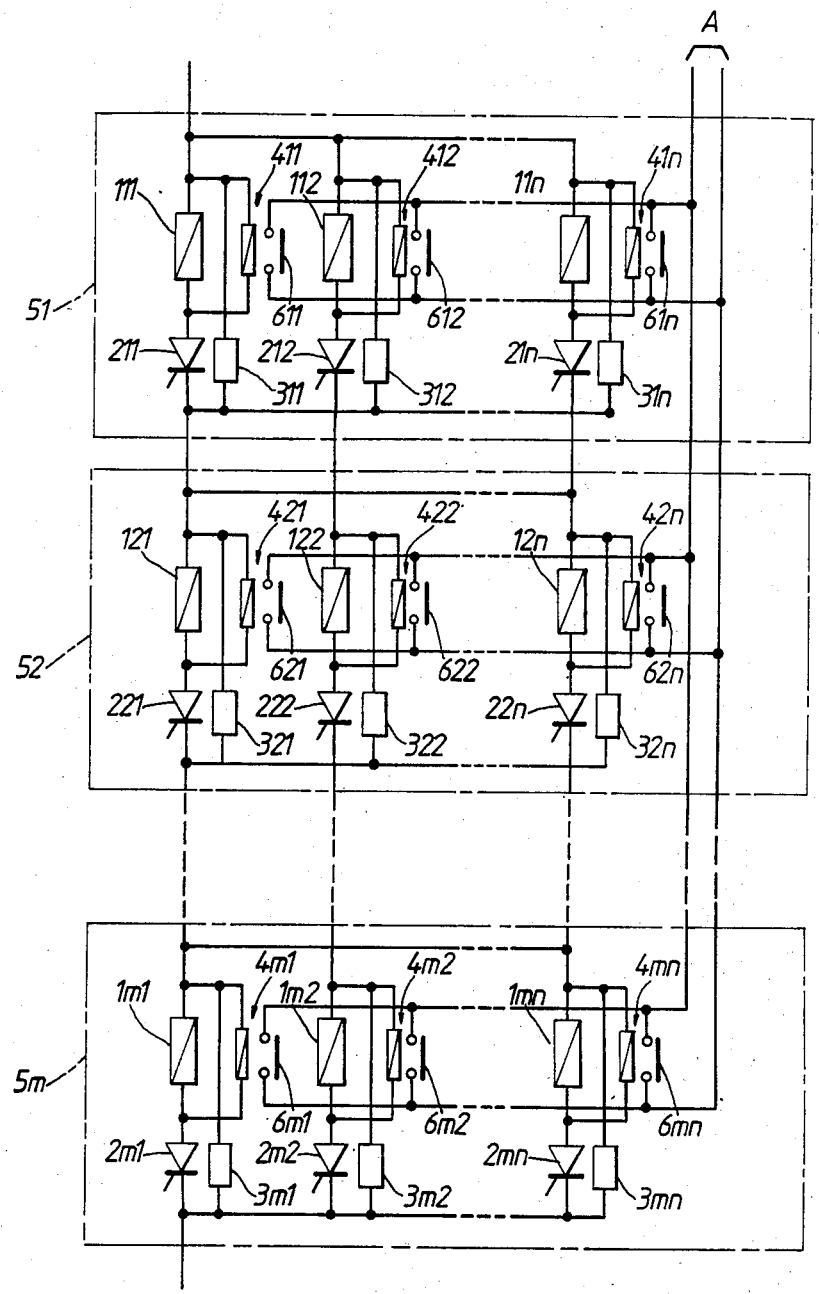
Figure 6:
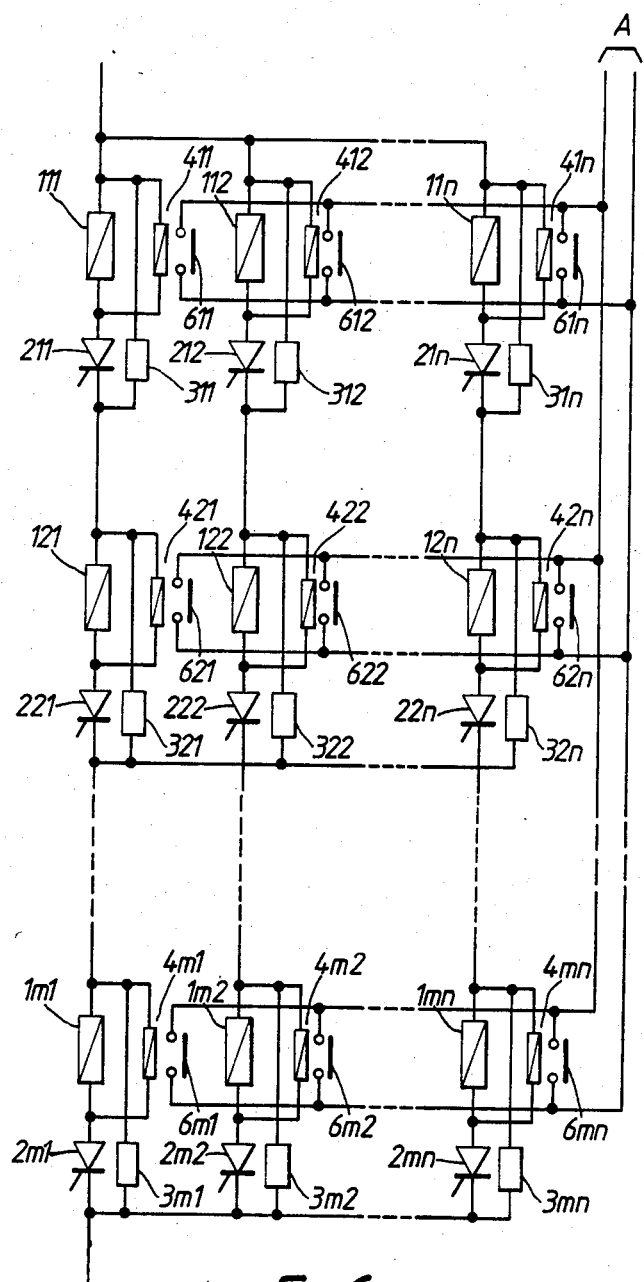

FIGS. 5 and 6 show two embodiments of the invention which provide the additional feature that the operations of the load powered by the power converter can be halted when any fuse of the protection circuit fuses. FIG. 5 shows a circuit in which plural thyristors are connected in the mesh configuration discussed above in connection with FIG. 3. Again, reference numerals 111, 112, ... 1mn designate fuses, 211, 212, ... 2mn semiconductors such as thyristors, and 311, 312, ... 3mn nonlinear resistors. In this circuit, elements 411, 412, ... 4mn are trigger fuses. The trigger fuses 411, 412, ... 4mn each comprise switches 611, 612, ... 6mn which are closed when the associated fuses 111, 112 ... 1mn are fused. Here, m identical circuits 51, 51, ... 5m are provided and are connected in series; each of the m circuits comprises n individual unit circuits connected in parallel.

As shown in FIG. 5, the unit circuits comprise nonlinear resistors 311, 312, ... 3mn connected in parallel with the combination of series-connected fuses 111, 112, ... 1mn and thyristors 311, 312, ... 3mn. Trigger fuses 411, 412, ... 4mn are connected in parallel with the respective fuses 111, 112, ... 1mn. Further, n unit circuits are connected in parallel to constitute circuits 51, 52, ... 5m, which are connected in series. As shown the switches 611, 612, 6mn of the trigger fuses 411, 412, ... 4mn are all connected in parallel, so that when any of them is closed by fusing of the associated fuse 111, 112, ... 1mn a fusing-indicating signal "A" is produced. Signal "A" can be used to deactivate the power converter.

The circuit of FIG. 5 operates as follows. Assume that all the thyristors 211, 212, ... 2mn are operational when fuse 111 is fused for some reason. If the number of parallel connections n is sufficiently large, the additional current shared by the n-1 thyristors 212, 213, ... 21n is not increased significantly when thyristor 211 is disconnected. Therefore operation of the power converter apparatus can continue. For example, if n=10, when one thyristor of ten parallel-connected thyristors is removed from the circuit by fusing of its fuse, the current then carried by the other thyristors becomes approximately 1.11 times the normaal current (10/9=1.11). Accordingly, if thyristors are selected which can carry 111% of the normal current, the apparatus can continue to operate, when one of the n fuses is fused. However, if n=2, for example, the current increase is 100% when a single fuse is used, because the ratio of currents between normal and failure is 2/1=2.0. It would be extremely expensive to use thyristors having a current-carrying capability of 200% of the normal current.

Therefore, when n is low, operation of the power converter must be halted when one of the fuses is fused, to protect the other thyristors from overcurrent.

According to the present invention, the trigger fuses 411, 412, ... 4mn serve to detect fusing of one of the fuses 111, 112, ... 1mn when a fuse is fused. The fusing indicating signal "A" triggers a gate control device (not shown), which halts the operation of the power-converter apparatus. If the thyristors 211, 212, ... 2mn are ordinary thyristors, the apparatus can be stopped within a half cycle, by blocking the thyristor gates. If the thyristors, 211, 212, ... 2mn are gate-turn-off thyristors signals halting the operation of the apparatus can be stopped within approximately 20 μsec by sending turning-off signals to the thyristor gates.

The non-linear resistors 311, 312, ... 3mn function to prevent arcing in a manner identical to their function in the circuit of the invention in the embodiment shown in FIG. 3, that is, by absorption of the arcing current. The non-linear resistors 311, 312, ... 3mn may be connected in parallel with only the corresponding fuses 111, 112, ... 1mn, or in parallel with the series combination of the fuses 111, 112, ... 1mn and thyristors 221, 212, ... 2mn, as shown in FIG. 5.

FIG. 6 shows a further embodiment of the circuit according to the invention, in which plural thyristors are connected in string configuration in a manner similar to that of the circuit of FIG. 4. As shown, mn unit circuits, each comprising thyristors 211, 221, ... 2mn connected in series with fuses 111, 112, ... 1mn, non-linear resistors 311, 312, ... 3mn connected in parallel with the fuses 111, 112, ... 1mn or with the series combination of the fuses 111, 112, ... 1mn and thyristors 211, 212, ... 2mn, as shown, and trigger fuses 411, 412, ... 4mn comprising switches 611, 612, ... 6mn are provided. A number m of the unit circuits are first connected in series n of these series-connected unit circuits are connected in parallel. The functions of the unit circuits are identical to the functions described in connection with the circuit shown in FIG. 5.

Moreover, the present invention is not limited only to the embodiments described above with reference to FIG. 5 and FIG. 6 but is of use when n=1, that is, when a single series connected group of m unit circuits is employed.

In the above embodiments of the invention, as shown in FIG. 1 through FIG. 6, the arms of a power converter circuit each comprise series-connected unit circuits each including a semiconductor element and a fuse. According to these configurations, modular unit circuits can readily be prepared for convenient replacement of a damaged unit circuit. Moreover, an arm may comprise a series of semiconductors followed by a series of fuses.

The number of semiconductor elements and fuses in each unit may be selected suitably according to their current and voltage handling capacity and in accordance with the power converter specifications.

As described above, according to the present invention, there is provided a protection circuit for a power converter apparatus using nonlinear resistors to prevent excessive arcing of fuses so that fuses can be reliably, safely and economically employed in high voltage and high current applications. According to a further aspect of the invention, fusing of the fuses is detected and used to control automatically halting of the operation of the apparatus.

While a preferred embodiment on the invention has been described, the invention is not to be limited by this exemplary disclosure, but only by the following claims.

WHAT IS CLAIMED IS NEW AND DESIRED TO BE SECURED BY LETTERS PATENT OF THE UNITED STATES IS:

1. A protection circuit for a power converter apparatus including at least one unit circuit, said at least one unit circuit comprising:
   at least one fuse connected in series with at least one semiconductor element; and
   a non-linear resistor connected in parallel at least with said fuse.

2. A protection circuit for a power converter apparatus according to claim 1, wherein said nonlinear resistor is connected in parallel only with said fuse.

3. A protection circuit for a power converter apparatus according to claim 1, wherein said nonlinear resistor is connected in parallel with the series-connected combination of said at least one fuse and at least one semiconductor element.

4. The protection circuit of claim 1 wherein a plurality of said unit circuits are connected in series.

5. The protection circuit of claim 5 wherein two or more pluralities of unit circuits connected in series are connected in parallel.

6. A protection circuit for a power converter apparatus comprising at least one unit circuit, said at least one unit circuit, comprising:
   at least one fuse connected in series with a circuit including at least one semiconductor element;
   a nonlinear resistor connected in parallel at least with said fuse; and
   means for detecting fusing of said fuse and producing a signal responsive to said detection for halting the operation of said power converter apparatus.

7. The protection circuit of claim 6 wherein said means for detecting fusing of said fuse is a trigger fuse.

8. The protection circuit of Claim 6, wherein said nonlinear resistor is connected in parallel only with said fuse.

9. The protection circuit of claim 6, wherein said nonlinear resistor is connected in parallel with the series-connected combination of said at least one fuse and said at least one semiconductor element.

10. The protection circuit of claim 6 wherein plural unit circuits connected in series are provided.

11. The protection circuit for claim 6 wherein at least two of said pluralities of unit circuits connected in series are provided and are connected in parallel.

* * * * *